United States Patent
Lenski et al.

(10) Patent No.: US 8,652,917 B2
(45) Date of Patent: Feb. 18, 2014

(54) SUPERIOR STABILITY OF CHARACTERISTICS OF TRANSISTORS HAVING AN EARLY FORMED HIGH-K METAL GATE

(75) Inventors: Markus Lenski, Dresden (DE); Stephan Kronholz, Dresden (DE); Nadja Zakowsky, Radeberg (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 107 days.

(21) Appl. No.: 13/478,519

(22) Filed: May 23, 2012

(65) Prior Publication Data

US 2013/0316511 A1    Nov. 28, 2013

(51) Int. Cl.
*H01L 21/336*    (2006.01)

(52) U.S. Cl.
USPC .......................................... 438/303; 438/230

(58) Field of Classification Search
USPC ........................................................ 438/303
See application file for complete search history.

(56) References Cited

U.S. PATENT DOCUMENTS

| | | | | |
|---|---|---|---|---|
| 6,100,198 | A * | 8/2000 | Grieger et al. | 438/692 |
| 6,387,804 | B1 * | 5/2002 | Foster | 438/682 |
| 6,759,263 | B2 * | 7/2004 | Ying et al. | 438/48 |
| 6,900,143 | B1 * | 5/2005 | Pan et al. | 438/752 |
| 6,960,781 | B2 * | 11/2005 | Currie et al. | 257/19 |
| 7,037,793 | B2 * | 5/2006 | Chien et al. | 438/300 |
| 7,101,742 | B2 * | 9/2006 | Ko et al. | 438/197 |
| 7,231,682 | B1 * | 6/2007 | Boyd et al. | 15/77 |
| 7,288,489 | B2 * | 10/2007 | Dolechek et al. | 438/745 |
| 7,405,131 | B2 * | 7/2008 | Chong et al. | 438/300 |
| 7,902,082 | B2 * | 3/2011 | Park et al. | 438/757 |
| 2003/0124748 | A1 * | 7/2003 | Summerfelt et al. | 438/3 |
| 2003/0143853 | A1 * | 7/2003 | Celii et al. | 438/694 |
| 2005/0176205 | A1 * | 8/2005 | Chien et al. | 438/299 |
| 2006/0057811 | A1 * | 3/2006 | Chou et al. | 438/305 |
| 2008/0029835 | A1 * | 2/2008 | Beckert et al. | 257/412 |
| 2008/0179752 | A1 * | 7/2008 | Yamauchi et al. | 257/768 |
| 2008/0233702 | A1 * | 9/2008 | Mehrotra | 438/303 |
| 2009/0305511 | A1 * | 12/2009 | Fucsko et al. | 438/745 |
| 2010/0219474 | A1 * | 9/2010 | Kronholz et al. | 257/347 |
| 2010/0244155 | A1 * | 9/2010 | Carter et al. | 257/410 |
| 2012/0305995 | A1 * | 12/2012 | Javorka et al. | 257/288 |
| 2012/0306027 | A1 * | 12/2012 | Kronholz et al. | 257/410 |
| 2013/0210216 | A1 * | 8/2013 | Kronholz et al. | 438/478 |
| 2013/0277747 | A1 * | 10/2013 | Liu et al. | 257/368 |

* cited by examiner

*Primary Examiner* — Yu-Hsi D Sun
*Assistant Examiner* — Grant Withers
(74) *Attorney, Agent, or Firm* — Amerson Law Firm, PLLC

(57) ABSTRACT

When forming sophisticated transistors on the basis of a high-k metal gate electrode structure and a strain-inducing semiconductor alloy, a superior wet cleaning process strategy is applied after forming cavities in order to reduce undue modification of sensitive gate materials, such as high-k dielectric materials, metal-containing electrode materials and the like, and modification of a threshold voltage adjusting semiconductor alloy. Thus, the pronounced dependence of the threshold voltage of transistors of different width may be significantly reduced compared to conventional strategies.

20 Claims, 8 Drawing Sheets

SUPERIOR STABILITY OF CHARACTERISTICS OF TRANSISTORS HAVING AN EARLY FORMED HIGH-K METAL GATE

BACKGROUND OF THE INVENTION

1. Field of the Invention

Generally, the present disclosure relates to the fabrication of highly sophisticated integrated circuits including advanced transistor elements that comprise strain-inducing semiconductor alloys and gate structures of increased capacitance including a high-k gate dielectric.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, complementary transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, the conductivity of the channel region substantially affects the performance of MOS transistors.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows subsequent high temperature processes to be carried out, as are required, for example, during anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon and/or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling has to be maintained that is provided by the capacitor formed by the gate electrode, the channel region and the silicon dioxide disposed therebetween. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage, and thus reduced threshold voltage, may suffer from an exponential increase of the leakage current since the thickness of the silicon dioxide based gate dielectric layer is usually correspondingly reduced to provide the required capacitance between the gate and the channel region. For example, a channel length of approximately 80 nm may require a gate dielectric made of silicon dioxide as thin as approximately 1.2 nm. As a consequence, the relatively high leakage current caused by direct tunneling of charge carriers through an ultra-thin silicon dioxide based gate insulation layer may reach values for an oxide thickness in the range or 1-2 nm that may not be compatible with requirements for performance driven circuits.

Therefore, replacing silicon dioxide based material as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials such as tantalum oxide ($Ta_2O_5$), with a k of approximately 25, strontium titanium oxide (Sr-$TiO_3$), having a k of approximately 150, hafnium oxide ($HfO_2$), with a k of about 20, HfSiO, zirconium oxide ($ZrO_2$) and the like.

In addition to incorporating a high-k dielectric, transistor performance may be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Furthermore, it is difficult to achieve the required work function and thus threshold voltage values on the basis of doped polysilicon when using high-k dielectric materials. Thus, a gate stack has been suggested in which a high-k dielectric material provides an increased capacitance and maintains leakage currents at an acceptable level. On the other hand, a non-polysilicon material, such as titanium nitride and the like, may be formed so as to connect to the high-k dielectric material, thereby substantially avoiding the presence of a depletion zone and imparting an appropriate work function to the gate electrode.

After forming sophisticated gate structures including a high-k dielectric and a metal-based gate material, however, high temperature treatments may be required, which may result in a shift of the work function and a reduction of the permittivity of the gate dielectric, which may also be associated with an increase of layer thickness, thereby offsetting many of the advantages of the high-k dielectric in combination and the metal material. It is believed that the deterioration of the high-k metal gate is substantially caused by the incorporation of oxygen and respective oxygen diffusion within the high-k dielectric material, wherein the oxygen diffusion may be fed by oxygen contained in the ambient that may come into contact with the high-k dielectric during the processing of the devices.

In addition to a significant modification of the high-k dielectric material, also the work function of the metal in the gate stack may be shifted towards the center of the band gap, thereby modifying the threshold voltage of respective transistors. Due to the high oxygen affinity of the high-k dielectric material and the exposure to wet chemical etch procedures and cleaning processes, usually the gate stack is encapsulated after the patterning process in order to enhance stability of the high-k dielectric material and the respective metals in the gate stack. For this purpose, silicon nitride has proven to be a promising material due to its oxygen blocking characteristics. Hence, in typical conventional process flows, a silicon nitride liner with a thickness in the range of approximately 1-5 nm may be formed on exposed surface areas of the patterned high-k gate stack, wherein appropriate deposition techniques are used so as to not unduly affect device characteristics and/or the subsequent manufacturing steps. For example, well-established low pressure chemical vapor deposition (LPCVD) techniques may be applied for forming the silicon nitride liner.

In addition to providing sophisticated gate electrode structures by using high-k dielectric materials and metal-containing gate electrode materials, other approaches have been developed in order to enhance transistor performance for a given gate length and a thickness of a gate dielectric material. For example, by creating a certain strain in the channel region of the transistor elements, the charge carrier mobility, and thus the overall conductivity of the channel, may be enhanced. For a silicon material having a standard crystallographic configuration, i.e., a (100) surface orientation, with the channel length direction oriented along a <110> equivalent direction, the creation of compressive strain in the current flow direction may increase hole mobility and thus provide superior conductivity in P-channel transistors. Consequently, a plurality of strain-inducing mechanisms have been developed in the past which may per se require a complex manufacturing sequence for implementing the various strain-inducing techniques. For example, one promising approach that is frequently applied is the incorporation of a compressive strain-inducing silicon/germanium alloy in the drain and source areas of P-channel transistors. For this purpose, in an early manufacturing stage, cavities are formed selectively adjacent to the gate electrode structure of the P-channel transistor, while the N-channel transistors are covered by a spacer layer. Additionally, the gate electrode of the P-channel transistor has to be encapsulated in order to not unduly expose the gate electrode material to the etch ambient for forming the cavities and also for providing an efficient growth mask during the selective epitaxial growth process, in which the silicon/germanium alloy may be grown on a crystalline substrate material, while a significant deposition of the alloy on dielectric surface areas may be suppressed by appropriately selecting the corresponding process parameters.

A corresponding strain-inducing mechanism is a very efficient concept for improving transistor performance of P-channel transistors and, therefore, a combination with sophisticated gate electrode structures on the basis of high-k dielectric materials and metal gate electrodes is a very promising approach. Consequently, respective process strategies have been developed in which high-k metal gate electrode structures are formed in an early manufacturing stage, wherein, after the gate patterning process, a strain-inducing silicon/germanium alloy is formed in the drain and source areas of P-channel transistors. It turns out, however, that, although representing a promising process strategy, upon further reducing the gate length of the transistors, significant variations of transistor characteristics and reduced yield may be observed, as will be described in more detail with reference to FIGS. 1a-1j.

FIG. 1a schematically illustrates a cross-sectional view of a semiconductor device 100 in a manufacturing stage in which gate electrode structures 160a, 160b are formed on respective active regions 102a, 102b of the device 100. The active regions 102a, 102b are to be understood as semiconductor regions formed in a semiconductor layer 102, such as a silicon layer and the like, which in turn is formed above an appropriate substrate 101, such as a semiconductor substrate and the like. It should be appreciated that the substrate 101 is typically provided in the form of a wafer comprising a plurality of die regions (not shown), each of which in turn may include a plurality of active regions 102a, 102b, depending on the overall complexity of the circuitry to be formed in a single die region. Furthermore, a buried insulating material (not shown) may be provided below the semiconductor layer 102 if, for instance, an SOI (silicon-on-insulator) architecture is contemplated. The active regions 102a, 102b are typically laterally delineated by appropriate isolation structures (not shown), such as shallow trench isolations and the like. In the example shown, the active region 102a is basically of opposite conductivity type compared to the active region 102b so as to allow the fabrication of transistors of different conductivity type. For example, the active region 102a may correspond to a P-channel transistor. In the manufacturing stage shown, the gate electrode structures 160a, 160b may have a very similar configuration and may comprise a gate dielectric layer 163, which may comprise two or more sub-layers, depending on the overall process and device requirements. For example, a very thin conventional dielectric base layer 161, such as a silicon dioxide material, a nitrogen-enriched silicon dioxide material and the like, may be provided in combination with a high-k dielectric material 162, such as hafnium oxide and the like. It should be appreciated that two or more different high-k dielectric materials may be incorporated in the gate dielectric layer 163, if required. Furthermore, a metal-containing electrode material 164, such as titanium nitride and the like, is typically formed on the gate dielectric layer 163, followed by a further electrode material 165, such as silicon and the like. It should be appreciated that, in principle, these components may be provided in both the gate electrode structure 160a and the gate electrode structure 160b, however, these components may nevertheless differ, for instance, with respect to a work function metal species (not shown), which may be incorporated in the gate dielectric layer 163 and/or in the metal-containing electrode material 164. In this manner, an appropriate work function and thus threshold voltage may be adjusted. Moreover, the gate electrode structures 160a, 160b comprise a dielectric cap layer or layer system 166, for instance comprised of silicon nitride, possibly in combination with a thin silicon dioxide etch stop liner (not shown) and the like. As discussed above, in sophisticated applications, a length of the gate electrode structures 160a, 160b, i.e., the horizontal extension of the electrode material 164, may be 50 nm and significantly less.

Furthermore, frequently, a further band gap offset of transistors of different conductivity type or generally of different characteristics may be required, which is accomplished by incorporating an appropriate semiconductor alloy 102c in the active region 102a of one type of transistor. For example, frequently, a silicon/germanium alloy is provided as the material 102c with a well-defined germanium concentration and a corresponding layer thickness in order to adjust the electronic characteristics of a channel region of a transistor still to be formed in and above the active region 102a. To this end, the layer 102c may be provided with a thickness of 8-20 Å with a germanium concentration of 10-30 atomic percent, thereby efficiently adjusting the finally obtained transistor characteristics, for instance in terms of threshold voltage.

Furthermore, in the manufacturing stage shown, a spacer layer 167, which may be comprised of a liner 167a and a further layer 167b, is typically formed above the active regions 102a, 102b, wherein the thickness and the material characteristics of the spacer layer 167 are selected in view of increasing integrity of sensitive materials, such as the materials 162 and 164, and in view of adjusting an appropriate lateral offset of cavities to be formed in the active region 102a in a later manufacturing stage. To this end, silicon nitride base materials have proven to be viable candidates in order to provide a dense material layer with well-defined thickness.

The semiconductor device 100 as shown in FIG. 1 a is typically formed on the basis of the following processes. The active regions 102a, 102b are typically formed by incorporating an appropriate isolation structure by using sophisticated lithography, patterning, deposition, planarization and anneal techniques, thereby providing the isolation structures with appropriate lateral dimensions, which in turn define the size and shape of the active regions 102a, 102b. Prior to or after forming the isolation structures, the basic transistor characteristics may be adjusted by incorporating appropriate dopant species into the active regions 102a, 102b. Furthermore, prior to or after forming the isolation structures, the semiconductor alloy 102c, for instance in the form of a silicon/germanium alloy, is formed, for instance on the basis of well-established epitaxial growth techniques, wherein material composition and thickness are controlled so as to achieve the desired electronic characteristics. Thereafter, the dielectric materials for the gate dielectric layer 163 are deposited, followed by the deposition of appropriate metal-containing materials, which may then be patterned or otherwise treated in order to adjust a work function for corresponding gate electrode structures in accordance with the overall device requirements. Thereafter, the further materials 164, 165 and 166 may be formed by using well-established deposition techniques. Thereafter, sophisticated lithography and patterning strategies are applied, for instance by patterning the layer or layer system 166 and using the same as a hard mask for actually patterning the lower lying material layers, so as to obtain the gate electrode structures 160a, 160b having the desired dimension in a length direction, i.e., the horizontal direction of FIG. 1a, and in a width direction, i.e., a direction perpendicular to the drawing plane of FIG. 1a. As discussed above, after the above patterning sequence and the corresponding cleaning processes which are typically applied, sidewall surface areas of the sensitive materials 162, 164 have to be reliably covered in order to avoid undue changes of the material characteristics, which in turn would otherwise result in pronounced variations of transistor characteristics, such as threshold voltage and the like. To this end, the layer 167 is deposited, for instance by applying appropriate deposition techniques, for instance for forming a high density nitride material in the form of the layer 167a, followed by a low pressure chemical vapor deposition (CVD) process in order to form the layer 167b, which in combination provide an appropriate thickness as required for defining a lateral offset of cavities still to be formed.

FIG. 1b schematically illustrates the device 100 during an etch process 103 in which cavities 104 are formed in the active region 102a, which are subsequently filled with a strain-inducing semiconductor material, such as a silicon/germanium alloy. To this end, an appropriate etch mask 107, such as a resist mask, is formed above so as to cover respective areas in which the cavities 104 are not required. For example, the mask 107 covers the active region 102b comprising the gate electrode structure 160b, which is still covered by the spacer layer 167. On the basis of the etch mask 107, the etch process 103 is performed by using appropriate plasma assisted etch chemistries in order to etch through the spacer layer 167, thereby forming a sidewall spacer or offset spacer 167s of the gate electrode structure 160a. During the etch process 103, the etch chemistry may then be appropriately adapted so as to continue the etching in order to remove material from the active region 102a, thereby increasingly forming the cavities 104, whose lateral offset from the sensitive gate materials, such as the high-k dielectric material 162 and the metal-containing electrode material 164, is determined by the width of the spacer 167s and thus by the width and density of the spacer layer 167 for otherwise given etch parameters. Typically, the etch process 103 is continued until an etch depth of several tenths nanometers is achieved, depending on the requirement with respect to a corresponding strain to be achieved by the silicon/germanium alloy to be formed in the cavities 104. It should be appreciated that, during the etch process 103, also a sidewall of the semiconductor alloy 102c is exposed.

As discussed above, typically the width of the spacers 167s and thus the characteristics of the spacer layer 167 are selected such that a high degree of integrity of sensitive gate materials may be preserved, while at the same time an appropriate reduced lateral offset is adjusted for the cavities 104, since reducing the lateral offset may increase the efficiency of the strain-inducing effects. Furthermore, with respect to overall process efficiency, the spacers 167s may also be used as an appropriate offset spacer upon incorporating drain and source dopant species in a later manufacturing stage. As a consequence, in particular during the etch process 103, exposure of critical materials or a significant reduction of the thickness of the spacers 167s in critical device areas may result in undue interaction of process atmospheres with the sensitive materials, such as the materials 162, 164, during the further processing. Moreover, the material 102c may also be exposed during the further processing, for instance during respective cleaning processes, as will be described later on in more detail.

FIG. 1c schematically illustrates a top view of the device 100, i.e., of the active region 102a, which is enclosed by an isolation structure 106. The gate electrode structure 160a is formed above the active region 102a and extends into the isolation structure 106. As previously explained, overall performance of transistors significantly depends on the gate length, while the total current drive capability is determined for a given gate length by a width W of the corresponding transistor and thus of the corresponding active region 102a. Typically, transistors of different width have to be implemented in complex circuit designs, thereby requiring active regions of different widths. On the other hand, due to typical design rules, the threshold voltage of a specific type of transistor having a defined gate length should be constant, irrespective of the transistor width of corresponding devices. It turns out, however, that a pronounced variation of threshold voltages for different transistor widths for otherwise identical transistor characteristics may be observed, which is assumed to be caused by undue interaction of sensitive materials with process atmospheres. For example, during the above etch sequence, sensitive materials may be exposed or the thickness of the encapsulating silicon nitride material may be significantly reduced, in particular in an area 105, wherein corresponding "edge effect" may thus affect the total transistor characteristics differently for different transistor widths.

FIG. 1d schematically illustrates the device 100 in a further advanced manufacturing stage. After etching the cavities 104, appropriate cleaning processes have to be applied in order to remove contaminants generated during the preceding etch sequence, wherein well-established and efficient wet chemical agents are typically used. For example, in a first cleaning step 108, SPM (sulfuric acid/hydrogen peroxide mixture) and APM (ammonium hydroxide/hydrogen peroxide mixture) are typically applied since, in particular, APM has proven to be a highly efficient cleaning agent providing superior surface states with respect to organic and other contaminants. On the other hand, SPM may be advantageously used with respect to removing metal contaminants and the like. On the other hand, it has been observed that APM may interact with silicon/germanium, which may result in modification of material characteristics and removal of a portion of the layer 102c. As discussed above, however, a corresponding modification of the layer 102c may in turn result in a modification of the resulting transistor characteristics, which in turn may have a different effect on the total transistor characteristics, depending on the width of a corresponding transistor. Similarly, SPM, although highly efficient in cleaning surface areas, is known to interact with sensitive high-k dielectric materials, such as hafnium oxide based materials, which may result in a further oxidation of this material, which in turn may later be removed during the subsequent cleaning processing of the device 100. Furthermore, during the cleaning step 108, any exposed or insufficiently protected areas of the metal-containing electrode material 164 may be attacked, which may also contribute to variations of the overall transistor characteristics. Hence, during the cleaning step 108, a more or less pronounced modification of material characteristics may occur which, however, may also significantly depend on the overall process time, thereby contributing to an even more pronounced variability of threshold voltage characteristics with respect to different transistor widths.

Thereafter, a further cleaning step 109 is typically performed, for instance, immediately prior to performing an epitaxial growth process, thereby further removing contaminants, native oxide and the like, so as to prepare exposed surface areas in the cavities 104 for the deposition of a silicon/germanium alloy. As explained before, the process 109 may also "efficiently" remove previously oxidized portions of the sensitive material 162. On the other hand, replacing the very efficient cleaning agent hydrogen fluoride (HF) with any less aggressive cleaning agents may have a negative effect on the subsequent epitaxial growth process.

FIG. 1e schematically illustrates the device 100 in a further advanced manufacturing stage. As shown, a silicon/germanium alloy 151 is formed in the cavities 104 and thus induces a compressive strain in a channel region 152. As discussed above, the silicon/germanium alloy is typically formed on the basis of well-established epitaxial growth recipes wherein process parameters are adjusted such that significant material deposition on dielectric surface areas, such as the silicon nitride layer 167 (FIG. 1d), the cap layer 166 and the spacer 167s is suppressed. Thereafter, a further etch mask 110 is formed so as to cover the gate electrode structure 160a and the active region 102a, while the active region 102b is exposed. On the basis of a further etch process 119, the exposed spacer layer 167 (FIG. 1d) may be etched in order to obtain the spacer elements 167s on the gate electrode structure 160b. Consequently, after the etch process 119, the gate electrode structures 160a, 160b may have substantially the same configuration and the further processing may be continued on the basis of similar conditions for the gate electrode structures 160a, 160b.

FIG. 1f schematically illustrates the device 100 after the removal of the etch mask 110 (FIG. 1e). In some approaches, drain and source dopant species may be incorporated into the respective active regions 102a, 102b using the spacers 167s as an implantation mask, while the cap layer 166 is still in place. In other cases, the device 100 is subjected to a process sequence in which the dielectric cap layer 166 is selectively removed substantially without affecting the spacers 167s in order to not unduly jeopardize integrity of sensitive gate materials.

FIG. 1g schematically illustrates the semiconductor device 100 in a manufacturing stage in which sacrificial spacers 111 are formed on the spacers 167s, which is typically accomplished by depositing an appropriate spacer material (not shown), such as silicon dioxide when the cap layers 166 are substantially comprised of silicon nitride. In any case, the material for the spacers 111 is selected so as to efficiently protect the spacers 167s and to allow a subsequent removal of the spacers 111 without contributing to undue material removal of the spacers 167s. Hence, after depositing an appropriate spacer material, a plasma assisted etch process is applied so as to form the spacers 111 which, however, may result in a certain degree of material erosion in the active regions 102a, 102b, as indicated by 102r.

FIG. 1h schematically illustrates the device 100 during an etch process 112, for instance a plasma based etch process, in which the cap layers 166 (FIG. 1g) are removed while the sacrificial spacers 111 preserve integrity of the spacer structure 167s. During the etch process 112, further material may be removed, thereby possibly increasing the recess 102r, which may thus result in a certain degree of material loss of the strain-inducing semiconductor alloy 151. Thereafter, the sacrificial spacers 111 may be removed, for instance, by well-established wet chemical etch chemistries and the like, wherein selective etch recipes may be applied, for instance, for removing silicon dioxide selectively with respect to silicon, silicon nitride and the like.

FIG. 1i schematically illustrates the device 100 in a manufacturing stage in which drain and source dopant species are incorporated into the active regions 102a, 102b on the basis of respective implantation processes 114a, 114b, possibly in combination with the introduction of further well dopant species by applying tilted implantation processes 113a, 113b. In this manner, halo regions may be incorporated, if required. It should be appreciated that the implantation process 114a, 114b and/or 113a, 113b may be carried out prior to or after removing the cap layers 166 (FIG. 1f), depending on the overall process strategy.

FIG. 1j schematically illustrates the semiconductor device 100 in a further advanced manufacturing stage. As illustrated, drain and source regions 153 are formed in the active regions 102a, 102b and have respective concentration profiles as required for the characteristics of transistors 150a, 150b, respectively. Moreover, metal silicide regions 154, for instance comprised of nickel silicide and the like, may be formed in the drain and source regions 153. Furthermore, the gate electrode structures 160a, 160b may comprise an additional spacer structure 169, which may have any appropriate configuration in order to allow appropriate profiling of the drain and source regions 153 and adjust a lateral offset of the metal silicide regions 154 with respect to the channel region 152. Furthermore, a metal silicide 168 may also be provided in the gate electrode structures 160a, 160b.

The transistors 150a, 150b may be formed on the basis of well-established process strategies, for instance by forming the spacer structure 169 and incorporating additional drain and source implantation species followed by high temperature anneal processes in order to adjust the final lateral and vertical dopant profile of the drain and source regions 153. Thereafter, the metal silicide regions 154 and 168 may be formed on the basis of well-established process strategies.

Consequently, the above-described process sequence is basically a very promising approach for incorporating the strain-inducing semiconductor alloy 151 in the context of sophisticated gate electrode structures, wherein, however, uniformity of transistor characteristics may sensitively depend on the characteristics of the threshold voltage adjusting semiconductor alloy 102c for the transistor 150a and the sensitive gate dielectric material 163 in combination with the metal-containing electrode material 164. That is, as discussed above, in particular the process sequence for incorporating the strain-inducing material 151 for the transistor 150a may result in a pronounced dependency of threshold voltage on the width of a corresponding transistor so that, with the various transistor widths required by a certain circuit design, a variation of 100 mV and even more may be observed in the finally obtained semiconductor device. Since a corresponding spread of the threshold voltages is extremely difficult to be taken into consideration during the design of a semiconductor device, the above-described process sequence, although basically very promising, may result in a pronounced yield loss.

According to the situation described above, the present disclosure relates to manufacturing techniques in which high-k metal gate electrode structures may be combined with strain-inducing semiconductor materials, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques in which superior uniformity of transistor characteristics, in particular a reduction of threshold voltage variability, may be accomplished by specifically addressing integrity of sensitive gate materials and threshold voltage adjusting semiconductor materials when incorporating a strain-inducing semiconductor alloy in the active region of specific transistors. To this end, an appropriate cleaning regime may be applied after forming corresponding cavities in the active region, which are appropriately configured to ensure sufficient efficiency with respect to removing contaminants and conditioning surface areas while, however, avoiding undue modification of characteristics of sensitive materials.

One illustrative method disclosed herein comprises forming a cavity in an active region of a semiconductor device in the presence of a gate electrode structure that comprises a high-k dielectric material. The method further comprises performing a first wet cleaning process so as to clean a rear side of the substrate of the semiconductor device while rinsing the active region formed in a front side of the substrate. The method additionally comprises performing a second wet cleaning process prior to performing an epitaxial growth process. Furthermore, a semiconductor alloy is formed in the cavity by performing the epitaxial growth process. Additionally, the method comprises forming drain and source regions in at least a portion of the semiconductor alloy.

A further illustrative method disclosed herein comprises cleaning a rear side of a substrate while continuously rinsing a front side of the substrate, wherein the front side comprises an active region of a semiconductor device, a gate electrode structure formed on the active region and a cavity formed laterally adjacent to the gate electrode structure. The gate electrode structure comprises a high-k dielectric material and an offset spacer. The method further comprises cleaning the front side by using at least one of sulfuric acid, ozone, hydrogen peroxide, ammonium hydroxide and hydrogen fluoride. Moreover, a strain-inducing semiconductor alloy is formed in the cavity and drain and source regions are formed in the active region.

A still further illustrative method disclosed herein comprises forming a first gate electrode structure on a first active region and a second gate electrode structure on a second active region of a semiconductor device that is formed on a substrate. The first and second gate electrode structures comprise a metal-containing electrode material formed on a gate insulation layer that includes a high-k dielectric material. The first and second active regions are of different conductivity type. The method further comprises forming a spacer from a spacer layer selectively on the first gate electrode structure and preserving the spacer layer above the second active region. Moreover, cavities are formed in the first active region by using the spacer so as to define a lateral offset of the cavities from the high-k dielectric material. Furthermore, a rear side of the substrate is cleaned, while a front side thereof is continuously rinsed by using de-ionized water and avoiding the presence of ozone. The method further comprises cleaning the front side by using at least one of sulfuric acid, ozone, hydrogen peroxide and ammonium hydroxide. Moreover, exposed surface areas of the cavities are treated with hydrogen fluoride (HF) so as to prepare the exposed surface areas for a subsequent epitaxial growth process. Additionally, the method comprises forming a strain-inducing semiconductor alloy in the cavities by performing the epitaxial growth process.

BRIEF DESCRIPTION OF THE DRAWINGS

The disclosure may be understood by reference to the following description taken in conjunction with the accompanying drawings, in which like reference numerals identify like elements, and in which.

Figure 1A:
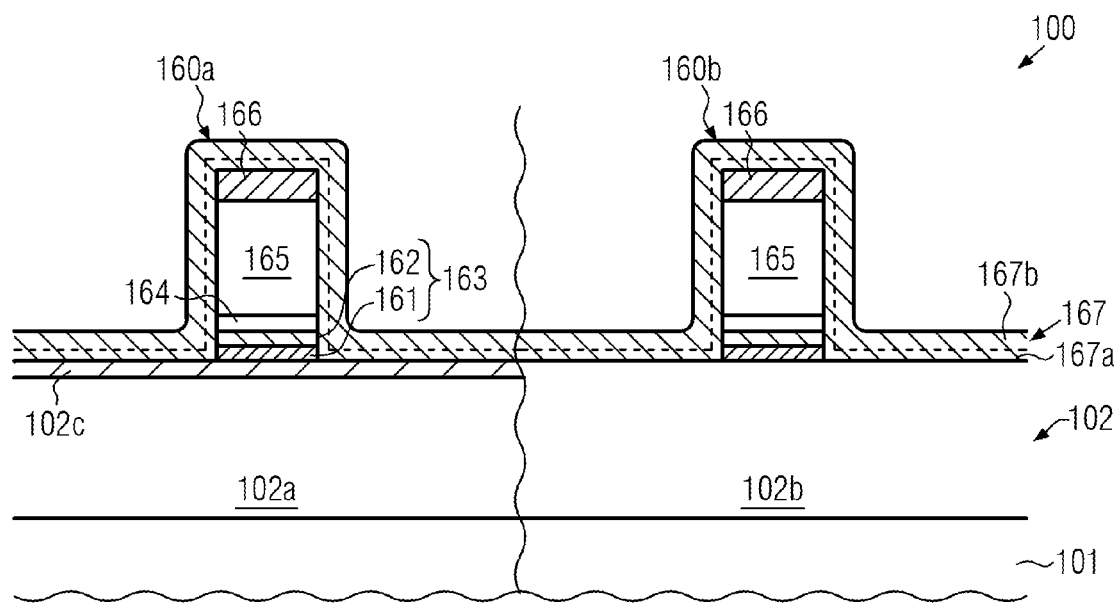
FIGS. 1a-1j schematically illustrate cross-sectional views of a semiconductor device during various manufacturing stages when forming sophisticated transistors based on a high-k metal gate electrode structure and a strain-inducing semiconductor alloy, according to sophisticated conventional process strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which a superior cleaning regime may be implemented into the process flow without contributing to additional process complexity while still ensuring high efficiency in removing contaminants and conditioning surface areas when incorporating a strain-inducing semiconductor alloy in an active region of a transistor comprising a high-k metal gate electrode structure. To this end, it has been recognized that the pronounced dependence of threshold voltages from transistor width, in particular for transistors having incorporated therein a strain-inducing semiconductor alloy in combination with high-k metal gate electrode structures, may be reduced by specifically designing the cleaning sequence to be applied after etching cavities into the corresponding active region of the transistor under consideration. As previously discussed, in particular in this specific process stage, sensitive device materials, such as sensitive gate materials and a threshold voltage adjusting semiconductor alloy, may have an increased tendency to interact with the wet chemical agents of a cleaning recipe, which may particularly contribute to a pronounced "edge" effect, which in turn may significantly contribute to the pronounced threshold voltage differences of transistors of different width. In this respect, it has been recognized that, for instance, in some illustrative embodiments, a treatment with ozone may be avoided when rinsing the front side of a substrate while efficiently removing any contaminants from a rear side of the substrate after the etch sequence for providing cavities in a corresponding active region. Furthermore, in some illustrative embodiments, it has been recognized that by continuously rinsing the front side, any incorporation of contaminants from the substrate edge may be efficiently suppressed, thereby also contributing to a superior surface state of the substrate prior to continuing with a further cleaning step for preparing exposed semiconductor surface areas for a subsequent selective epitaxial growth process.

Furthermore, the well-established SPM may be efficiently replaced by SOM (sulfuric acid/ozone mixture) during the cleaning of the front side and thus of the cavities in the active region without negatively affecting the further processing, while at the same time significantly reducing the interaction of the cleaning agents with sensitive gate materials.

With reference to FIGS. 2a-2e, further illustrative embodiments will now be described in more detail, wherein reference is also made to FIGS. 1i-1j in order to not unduly repeat the description of process steps, materials and the like.

Figure 2A:
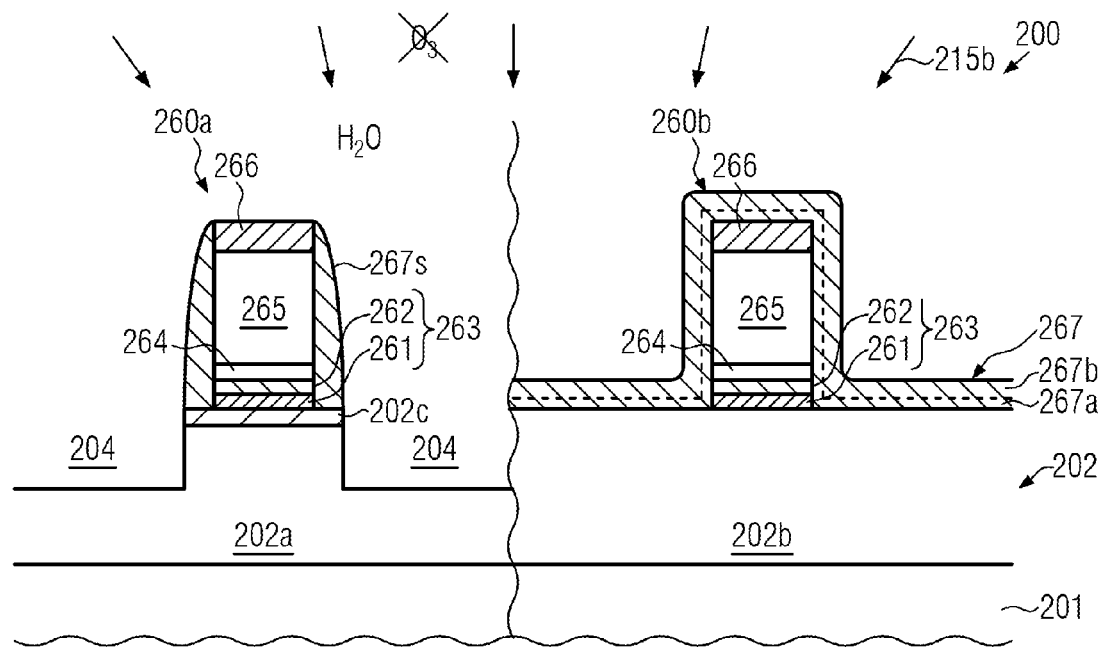
FIGS. 2a-2e schematically illustrate cross-sectional views of a semiconductor device during various manufacturing stages when sophisticated transistors are formed on the basis of a superior cleaning regime in order to preserve integrity of sensitive materials in high-k metal gate electrode structures while reducing variability of transistor characteristics, such as dependency of threshold voltage on transistor width, according to illustrative embodiments.
Figure 2B:
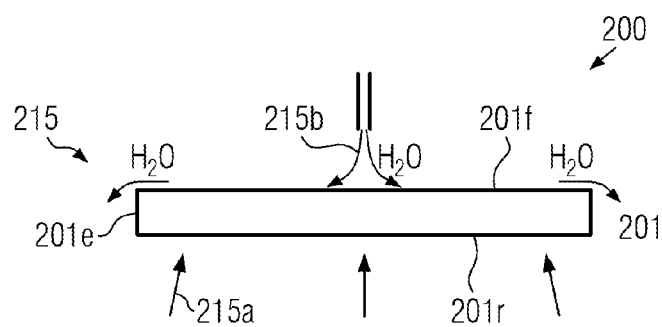

FIG. 2a schematically illustrates a cross-sectional view of a semiconductor device 200 comprising a substrate 201 having a rear side 201r and a front side 201f (see FIG. 2b). A semiconductor layer 202, such as a silicon layer or any other appropriate semiconductor material, may be formed on the front side 201f of the substrate 201, possibly in combination with a buried insulating material (not shown), if an SOI configuration is considered. The semiconductor layer 202 may be divided into a plurality of active regions, which in turn may be laterally delineated by appropriate isolation structures, such as shallow trench isolations and the like, as is also discussed above with reference to the semiconductor device 100. For example, a first active region 202a may be provided so as to correspond to a transistor which may require the incorporation of a strain-inducing semiconductor alloy, such as a silicon/germanium alloy, a silicon/tin alloy, a silicon/germanium/tin alloy, a silicon/carbon alloy and the like, in order to increase charge carrier mobility and thus enhance overall performance of a corresponding transistor, as is also discussed above. Furthermore, the active region 202a may comprise a threshold voltage adjusting semiconductor alloy 202c, such as a silicon/germanium alloy or any other appropriate semiconductor composition providing the desired electronic characteristics in view of threshold voltage adjustment and the like, as is also discussed above. Similarly, a second active region 202b may be provided, which in the embodiment shown may be of opposite conductivity type compared to the active region 202a. In the manufacturing stage shown, a gate electrode structure 260b may be formed on the active region 202b and may comprise a gate dielectric layer 263, for instance comprising two or more sub-layers, such as a layer 261 and a layer 262, at least one of which may comprise a high-k dielectric material. For example, a sub-layer 262 may comprise one or more high-k dielectric materials. Furthermore, a metal-containing electrode material 264 may be formed on or above the gate dielectric layer 263, followed by a further electrode material 265, such as a semiconductor material such as silicon, silicon/germanium and the like. Furthermore, a cap layer or cap layer system 266 may be provided, for instance comprising silicon nitride, silicon dioxide and the like. Similarly, a gate electrode structure 260a may be formed on the active region 202a and may have basically the same configuration as the gate electrode structure 260b, except for any differences with respect to work function metal species, as is also discussed above. Furthermore, in this manufacturing stage, the gate electrode structure 260a may comprise a sidewall spacer 267s, while the gate electrode structure 260b is still covered by a spacer layer 267, which may comprise two or more sub-layers such as a liner 267a and a sub-layer 267b, which may be comprised of silicon nitride or any other appropriate high density material. Moreover, cavities 204 may be formed in the active region 202a, wherein a lateral offset from sensitive gate materials, such as the high-k dielectric material 262, may be substantially determined by the spacer 267s.

Figure 1B:
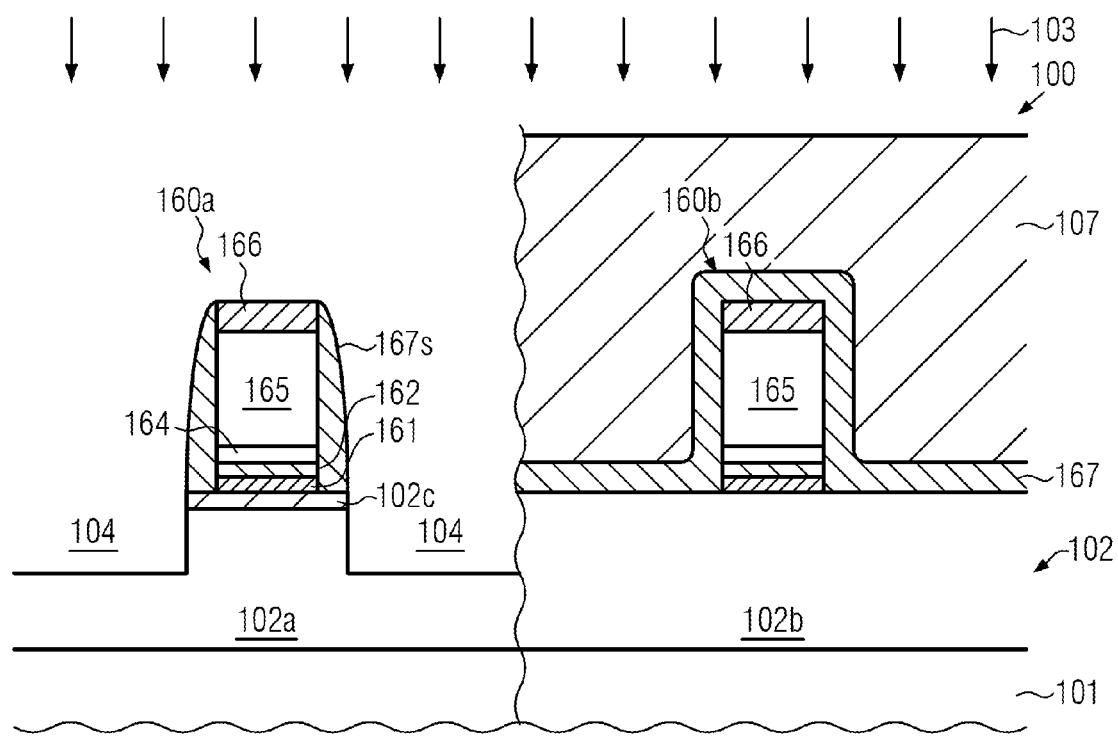
Figure 1C:
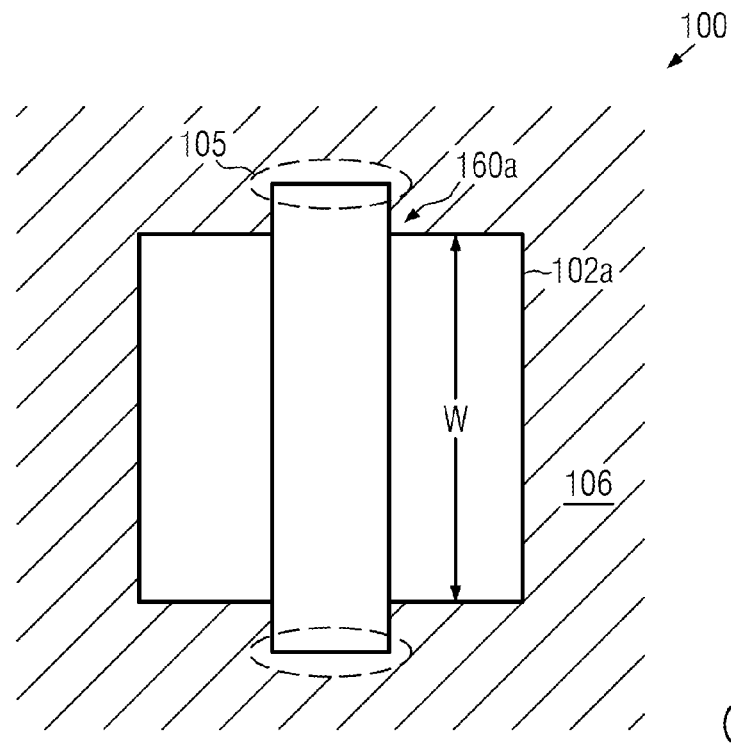
Figure 1D:
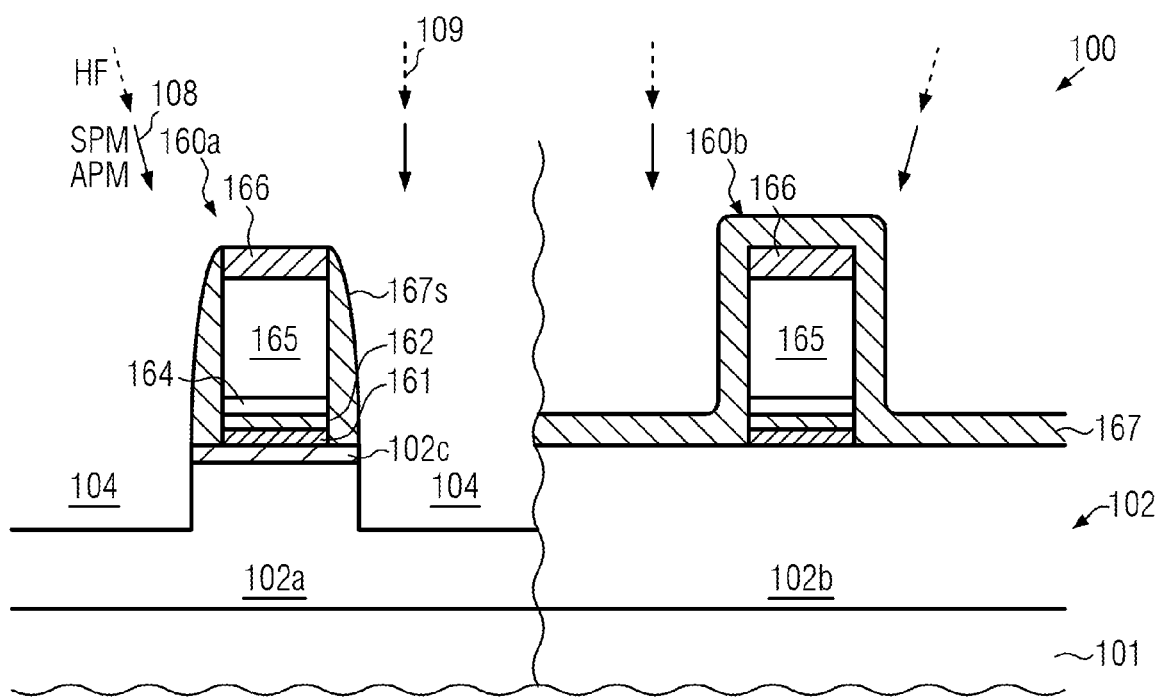

The semiconductor device 200 as shown in FIG. 2a may be formed on the basis of the same or similar process strategies as previously discussed above with reference to the semiconductor device 100 when referring to FIGS. 1a and 1b. Consequently, the gate electrode structures 260a, 260b may be formed on the basis of well-established process techniques in order to obtain the gate dielectric layer 263 with a high-k value and an appropriate physical thickness, while also an appropriate work function may be adjusted on the basis of any metal species incorporated therein and/or incorporated in the layer 264. Moreover, appropriate lateral dimensions with respect to gate length and gate width may be adjusted in accordance with the overall design rules, as is also previously discussed. Thereafter, the spacer layer 267 may be formed and patterned so as to obtain the spacer 267s on the gate electrode structure 260a, while also etching into the active region 202a, thereby forming the cavities 204. As discussed above, after the etch process for forming the cavities 204, such as the etch process 103 of FIG. 1b, a cleaning process may be applied. To this end, a process 215a (see FIG. 2b) may be applied to rear side 201r in order to remove contaminants, such as polymer residues and the like, which may have been formed during the preceding etch process. At the same time, the front side 201f comprising the active regions 202a, 202b and the gate electrode structures 260a, 260b formed thereon may be subjected to a rinsing process 215b so as to efficiently suppress the incorporation of any contaminants that may be removed from the rear side 201r. To this end, in one illustrative embodiment, a continuous supply of de-ionized water without any ozone may be used during the process 215b, thereby specifically avoiding undue interaction of ozone with exposed surface areas of the threshold adjusting semiconductor alloy 202c, which in some illustrative embodiments is provided in the form of a silicon/germanium material. It has been recognized that in particular ozone may modify the material characteristics of silicon/germanium, which in this phase of the process may, therefore, contribute to a variation and thus dependence of the threshold voltage on the transistor width. That is, as discussed above with reference to FIG. 1c, typically transistors of different widths are to be provided in the device 200 for a certain type of transistor, wherein, according to typical design rules, the associated threshold voltage should be identical for this type of transistor. Consequently, by avoiding undue modification of the previously adjusted material characteristics of the layer 202c, similar material characteristics of the layer 202c may be achieved, irrespective of the width of a corresponding active region 202a.

FIG. 2b schematically illustrates the device 200 wherein the entire substrate 201 is illustrated. As shown, the substrate 201 may be treated in some illustrative embodiments as a single substrate in a corresponding process tool (not shown) that is appropriately equipped for enabling single substrate processing. Hence, during the corresponding wet cleaning process 215, the rear side 201r may be treated with any appropriate wet chemical agent in order to remove any contaminants, while at the same time the front side 201f may be supplied with a continuous flow of de-ionized water that is free of ozone, which is to be understood that, except for any imperfections of the corresponding process tool, only insignificant amounts of ozone may be present. For example, the de-ionized water may be supplied such that any ozone may be present with less than 0.1 volume percent. In this embodiment, the de-ionized water is supplied as a continuous stream, thereby avoiding a spray application of de-ionized water, as it has been recognized that using a spray activity for applying any component at the front side 201f may still result in the incorporation of contaminants from the rear side 201r. On the other hand, by retaining a continuous rinsing migration of contaminants from the substrate edge 201e to the front side 201f may be efficiently suppressed.

Figure 2C:
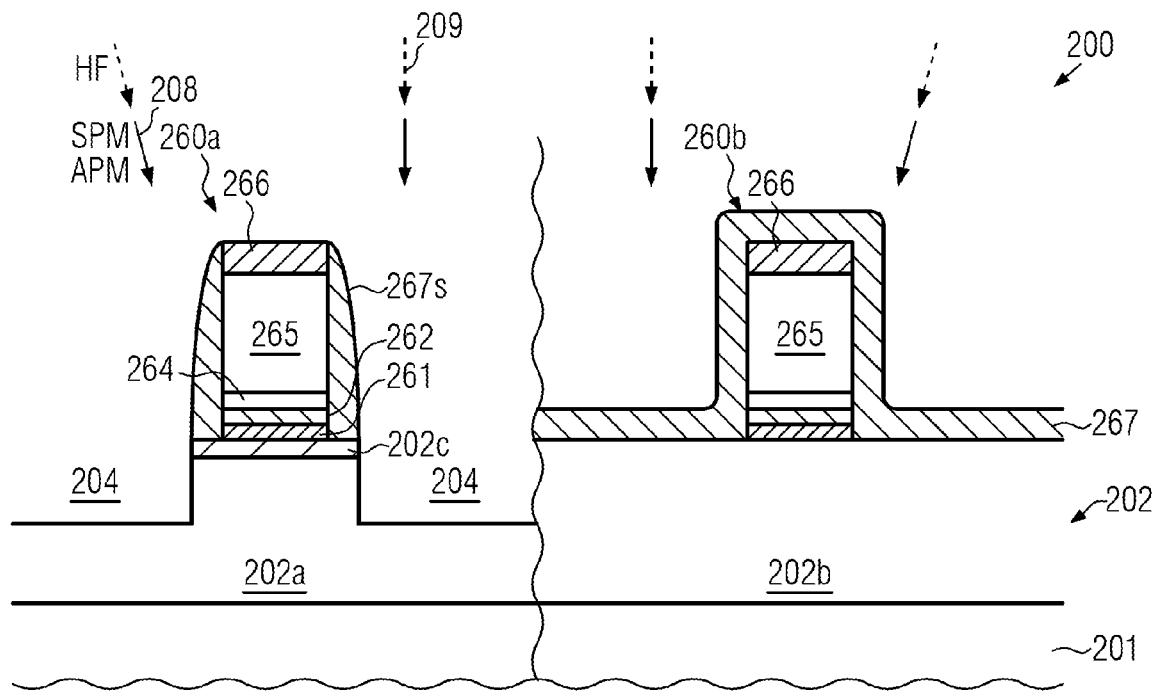

FIG. 2c schematically illustrates the device 200 during a further wet cleaning process 208, which is appropriately designed so as to clean the front side 201f and any device structure formed therein. To this end, the step 208 may be performed on the basis of SOM rather than using the well-established SPM chemistry in combination with APM, thereby still ensuring high efficiency of the cleaning process 208. Moreover, a typical process time in the step 208 may be restricted to 100 seconds and significantly less, thereby also reducing the degree of material modification compared to conventional SPM/APM based cleaning processes wherein typically process times of 200 seconds and higher are used, which may result in a significant dependence of material modification on process time variations. It should be appreciated that appropriate concentrations of the mixtures SOM and APM may be readily determined on the basis of experiments, while also an appropriate reduced process time in the above-specified range may be identified on the basis of test runs. Consequently, after the cleaning process 208, the device 200 may be ready for a further surface conditioning as required for an efficient selective epitaxial growth process. To this end, in some illustrative embodiments, a further wet cleaning process 209 may be applied, for instance on the basis of hydrogen fluoride (HF), thereby efficiently removing any native oxides and the like. It should be appreciated that due to the processes 215 (FIGS. 2b) and 208, a significantly reduced modification of any exposed surface areas, in particular of the sensitive high-k dielectric material 262, may have occurred so that, during the step 209, well-established recipes may be applied, for instance in terms of concentration and process time, in order to obtain superior conditions during the subsequent epitaxial growth process, however, without unduly removing or otherwise modifying the sensitive gate materials.

Figure 2D:
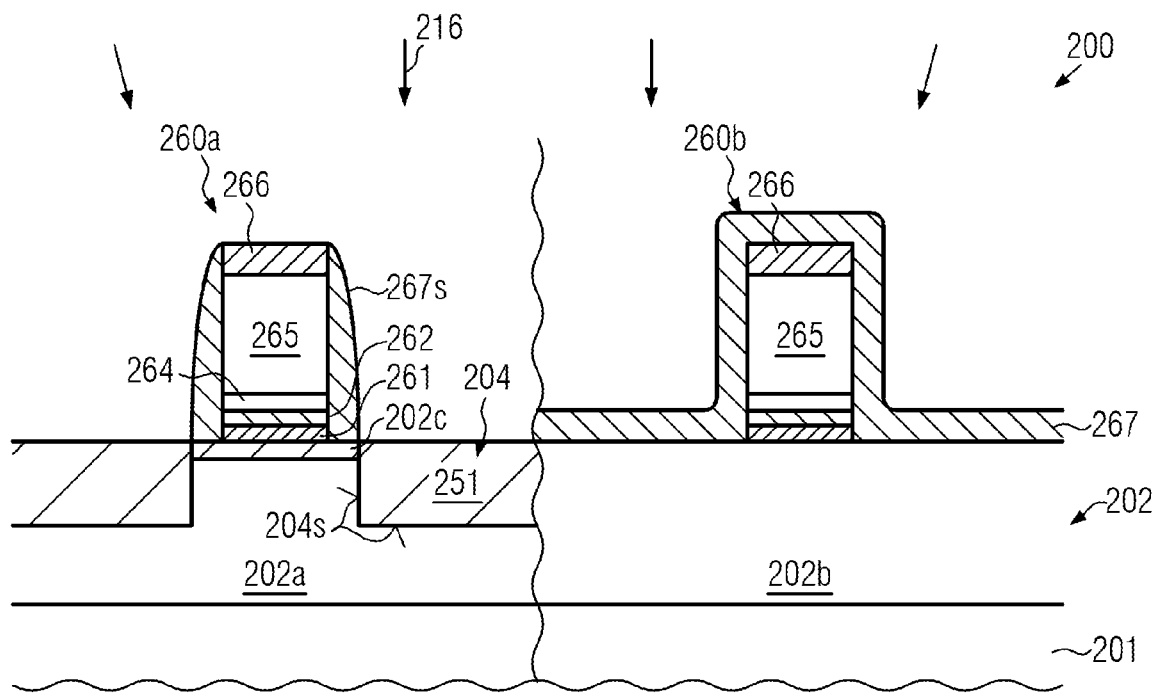

FIG. 2d schematically illustrates the semiconductor device 200 during a selective epitaxial growth process 216, in which a desired semiconductor alloy 251 may be formed in the cavities 204, the surface areas 204s of which have been efficiently cleaned and conditioned during the previous processing. During the selective epitaxial growth process 216, process parameters are adjusted such that the desired material may be deposited on exposed semiconductor surface areas, such as the surface areas 204s, or at least one of these surface areas having an appropriate surface orientation, while significant material deposition on dielectric surface areas, such as the cap layer 266, the spacer 267s and the spacer layer 267 is suppressed, as is also discussed above. Consequently, upon growing the material 251 in the cavities 204, the threshold voltage characteristics and the strain characteristics for a transistor to be formed in and above the active region 202a are substantially determined, while undue interaction of, in particular, cleaning atmospheres with the sensitive materials 202c, 262, 264 has been reduced compared to conventional approaches, as discussed above.

Figure 1E:
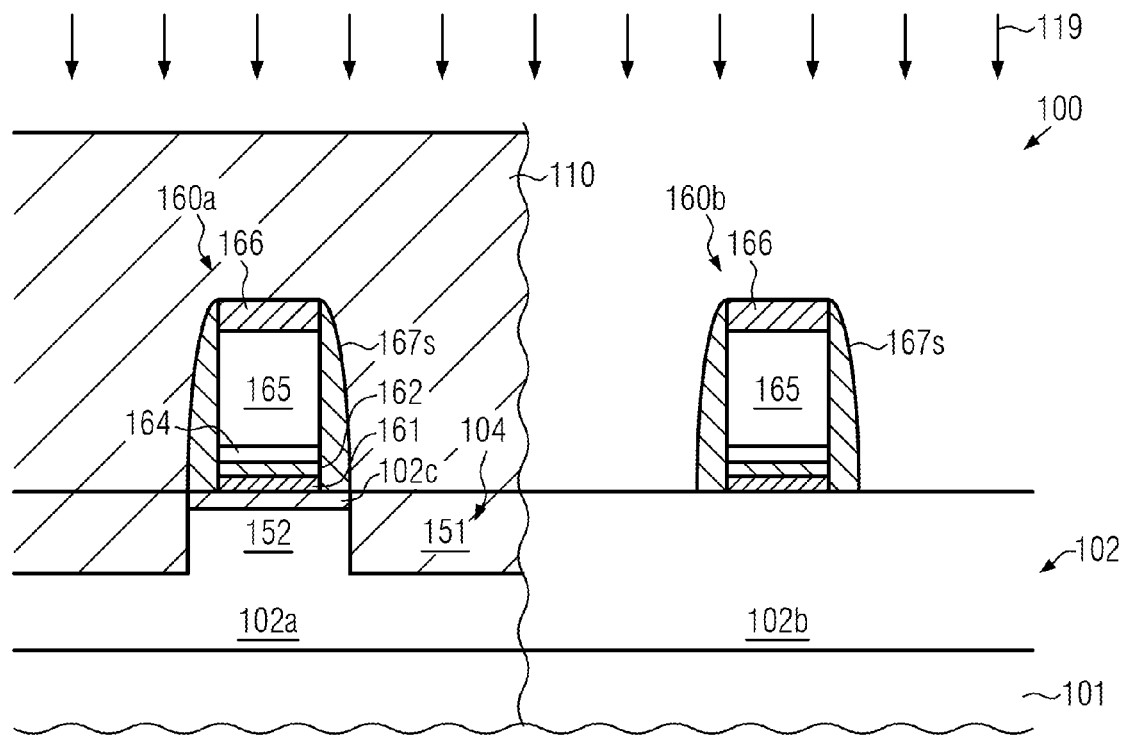
Figure 1F:
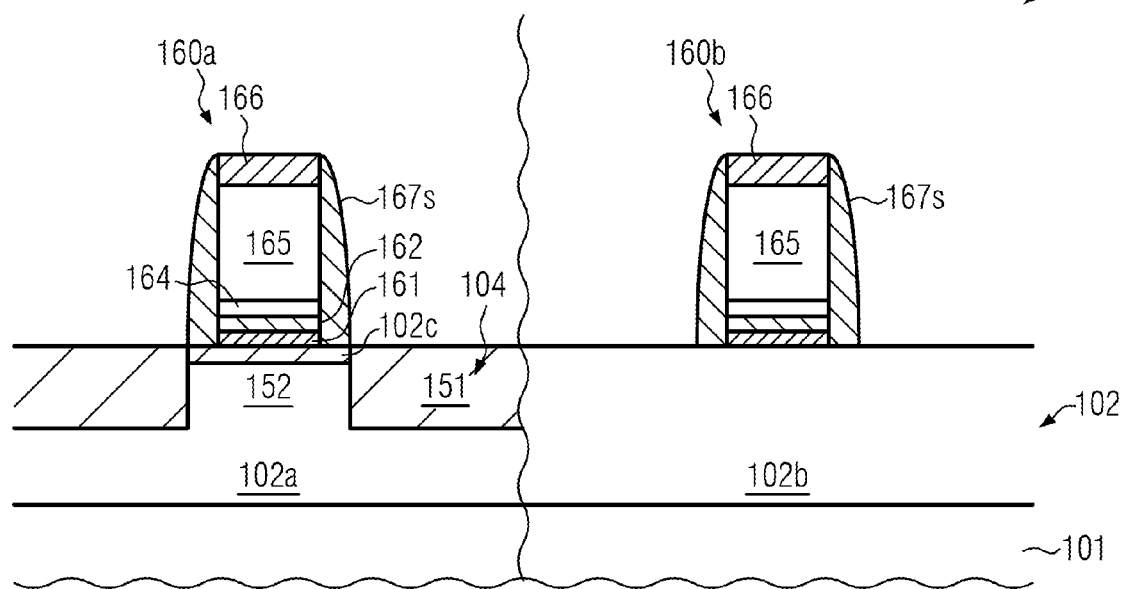
Figure 1G:
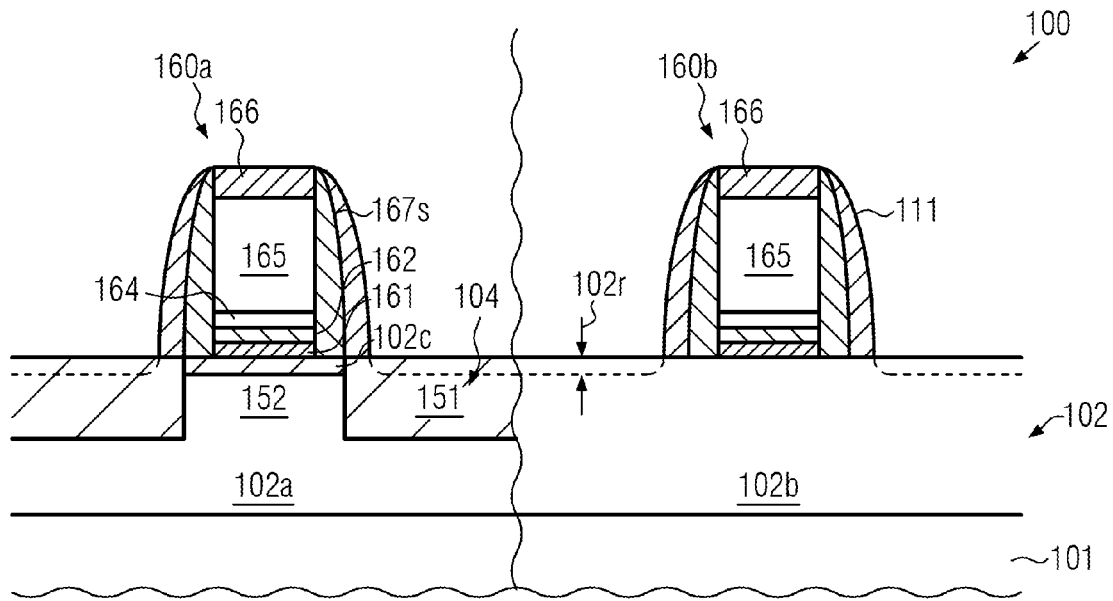
Figure 1H:
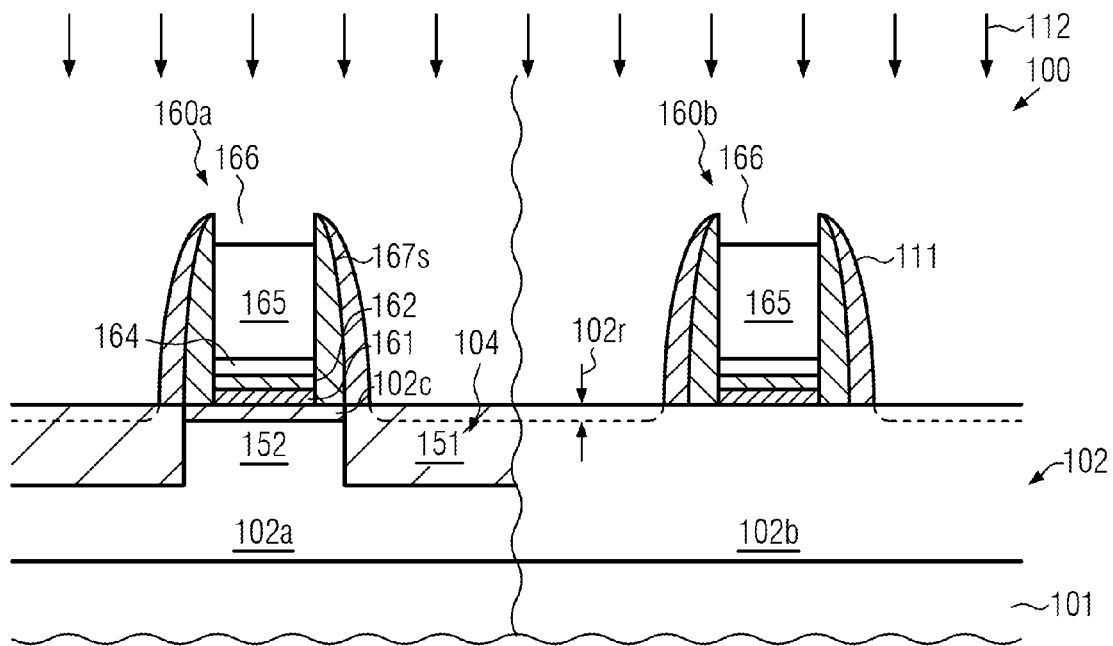
Figure 1I:
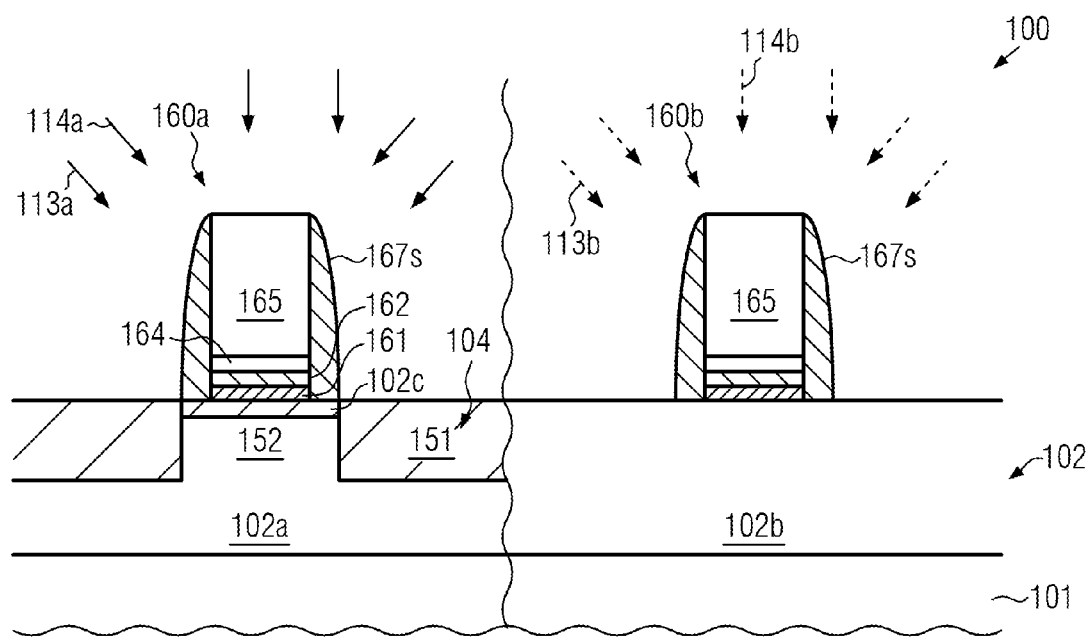
Figure 1J:
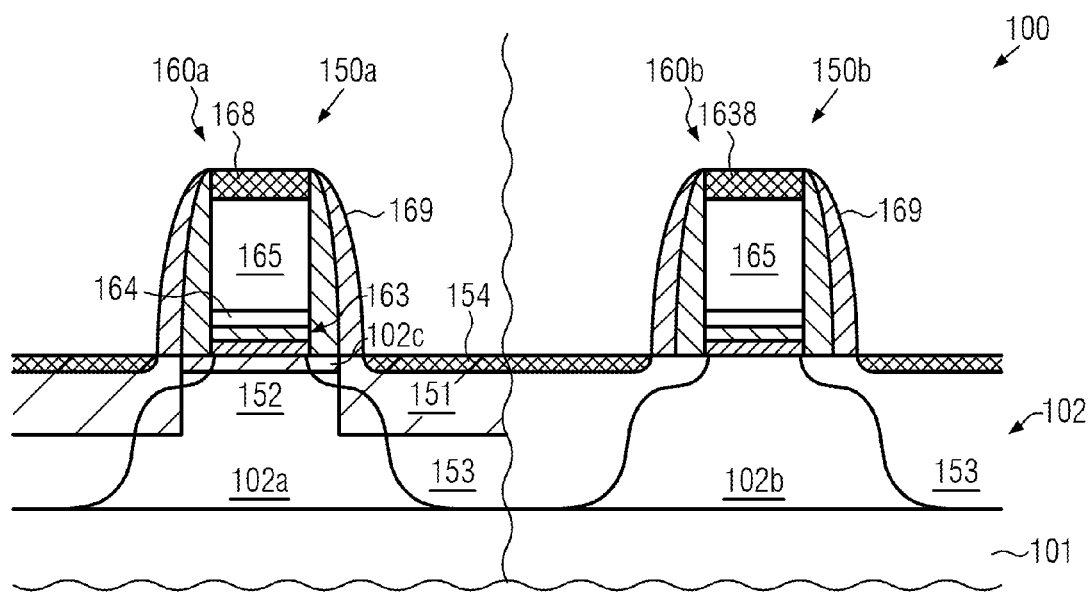

Thereafter, the further processing may be continued on the basis of process strategies as already described above with reference to the device 100. For example, a similar process strategy may be applied as, for instance, described with reference to FIG. 1e, in order to form a spacer element on the gate electrode structure 260b from the spacer layer 267, thereby obtaining a configuration similar to the configuration of the device 100 as shown in FIG. 1f. Prior to or after incorporating any drain and source dopant species by using the spacer 267s as an implantation mask, the cap layers 266 may be removed, as is, for instance, described with reference to the device 100 in the context of FIGS. 1g and 1h. The incorporation of a part of the drain and source dopant species and well dopant species may be accomplished on the basis of process techniques as described with reference to Figure 1i. Next, the drain and source regions may be completed and further processes may be performed in accordance with any appropriate process technique.

Figure 2E:
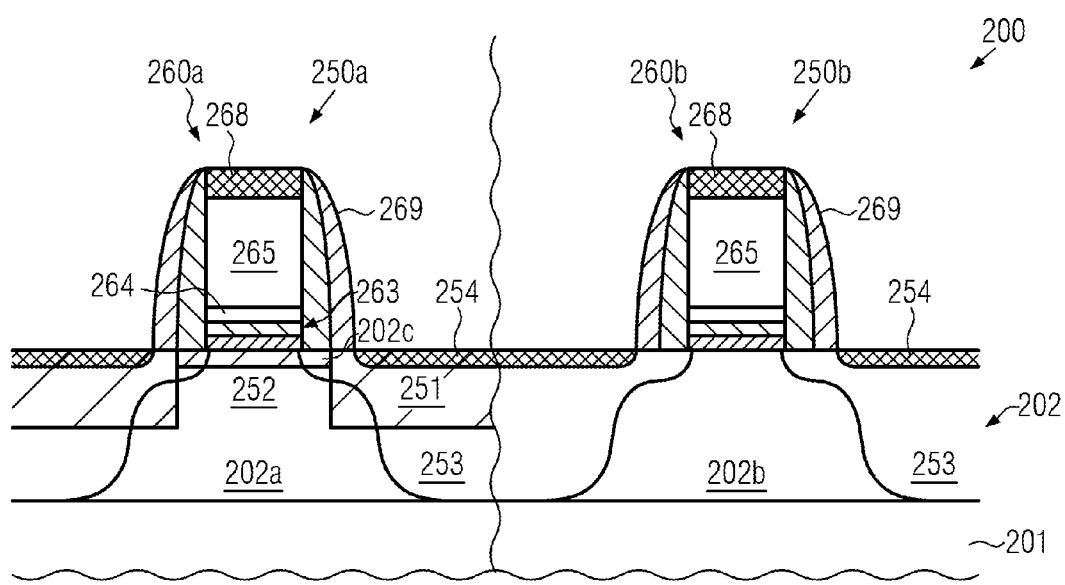

FIG. 2e schematically illustrates the semiconductor device 200 in a further advanced manufacturing stage. As illustrated, a transistor 250a may be formed in and above the active region 202a and may comprise the gate electrode structure 260a. Similarly, a transistor 250b may be formed in and above the active region 202b and may comprise the gate electrode structure 260b. Hence, drain and source regions 253 of a desired vertical and lateral dopant profile are formed in the active regions 202a, 202b, respectively, possibly in combination with respective metal silicide regions 254. Similarly, the gate electrode structures 260a, 260b may comprise an additional spacer structure 269 which, in combination with the spacer 267s, may thus define the profile of the drain and source regions 253 and the lateral offset of the metal silicide regions 254. Furthermore, a metal silicide 268 may also be formed in the gate electrode structures 260a, 260b. The transistors 250a, 250b, which may be of different conductivity type, may be formed in accordance with process techniques as also discussed above with reference to the device 100, wherein transistors 250a of different transistor width may be provided in the device 200 for otherwise identical transistor configuration. Due to the previously described superior cleaning recipe upon incorporating the strain-inducing semiconductor alloy 251, a significantly enhanced uniformity of the threshold voltage of transistors 250a of different transistor width may be obtained.

As a result, the present disclosure provides manufacturing techniques in which high-k metal gate electrode structures may be provided in an early manufacturing stage, i.e., significant transistor characteristics may be determined upon patterning the gate electrode structures on the basis of a high-k dielectric material and a metal-containing electrode material, possibly in combination with a threshold voltage adjusting semiconductor alloy formed in the corresponding active region, wherein a width-depending modification or change of these transistor characteristics may be significantly reduced upon incorporating a strain-inducing semiconductor alloy by applying an efficient wet cleaning process sequence.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a cavity in an active region of a semiconductor device in the presence of a gate electrode structure, said gate electrode structure comprising a high-k dielectric material;
   after forming said cavity performing a first wet cleaning process so as to clean a rear side of a substrate of said semiconductor device while rinsing said active region formed in a front side of said substrate;
   performing a second wet cleaning process prior to performing an epitaxial growth process;
   forming a semiconductor alloy in said cavity by performing said epitaxial growth process; and
   forming drain and source regions in at least a portion of said semiconductor alloy.

2. The method of claim 1, further comprising forming said gate electrode structure so as to have formed on sidewalls thereof at least an offset spacer for adjusting a lateral offset of said cavity from said high-k dielectric material.

3. The method of claim 2, further comprising introducing drain and source dopant species by using said offset spacer as an implantation mask.

4. The method of claim 1, further comprising forming a sacrificial spacer on sidewalls of said gate electrode structure after performing said epitaxial growth process and selectively removing a dielectric cap layer of said gate electrode structure in the presence of said sacrificial spacer.

5. The method of claim 4, further comprising removing said sacrificial spacer selectively to said offset spacer.

6. The method of claim 1, wherein performing said first wet cleaning process comprises suppressing the presence of ozone when rinsing said active region.

7. The method of claim 6, wherein rinsing said active region comprises continuously applying a rinsing agent to said active region.

8. The method of claim 1, wherein rinsing said active region comprises applying deionized water.

9. The method of claim 1, wherein said first wet cleaning process is performed on a single substrate basis.

10. The method of claim 1, wherein performing said second wet cleaning process comprises applying at least one of sulfuric acid, ozone, hydrogen peroxide and ammonium hydroxide.

11. The method of claim 10, wherein a mixture of sulfuric acid and ozone and a mixture of ammonium hydroxide and hydrogen peroxide are applied during said second wet cleaning process.

12. The method of claim 11, wherein exposure of said active region to at least said mixture of ammonium hydroxide and hydrogen peroxide is 100 seconds and less.

13. The method of claim 10, wherein performing said second wet cleaning process further comprises applying hydrogen fluoride (HF) after applying at least one of sulfuric acid, ozone, hydrogen peroxide and ammonium hydroxide.

14. The method of claim 1, further comprising forming a threshold voltage adjusting semiconductor alloy in said active region prior to forming said gate electrode structure.

15. A method, comprising:
cleaning a rear side of a substrate while continuously rinsing a front side of said substrate, said front side comprising an active region of a semiconductor device, a gate electrode structure formed on said active region and comprising a high-k dielectric material and an offset spacer, said active region comprising a cavity formed laterally adjacent to said gate electrode structure;
cleaning said front side by using at least one of sulfuric acid, ozone, hydrogen peroxide, ammonium hydroxide and hydrogen fluoride;
forming a strain-inducing semiconductor alloy in said cavity; and
forming drain and source regions in said active region.

16. The method of claim 15, wherein continuously rinsing said front side comprises applying deionized water and avoiding the presence of ozone.

17. The method of claim 15, wherein cleaning said front side comprises applying said hydrogen fluoride after using at least one of sulfuric acid, ozone, hydrogen peroxide and ammonium hydroxide.

18. The method of claim 17, wherein exposure of said front side to at least hydrogen peroxide and ammonium hydroxide is restricted to 100 seconds or less.

19. The method of claim 15, further comprising forming a threshold voltage adjusting semiconductor alloy in said active region prior to forming said gate electrode structure.

20. A method, comprising:
forming a first gate electrode structure on a first active region and a second gate electrode structure on a second active region of a semiconductor device formed on a substrate, said first and second gate electrode structures comprising a metal-containing electrode material formed on a gate insulation layer comprising a high-k dielectric material, said first and second active regions being of different conductivity type;
forming a spacer from a spacer layer selectively on said first gate electrode structure and preserving said spacer layer above said second active region;
forming cavities in said first active region by using said spacer so as to define a lateral offset of said cavities from said high-k dielectric material;
after forming said cavity cleaning a rear side of said substrate while continuously rinsing a front side by using deionized water and avoiding ozone;
cleaning said front side by using at least one of sulfuric acid, ozone, hydrogen peroxide and ammonium hydroxide;
treating exposed surface areas of said cavities with hydrogen fluoride (HF) so as to prepare said exposed surface areas for a subsequent epitaxial growth process; and
forming a strain-inducing semiconductor alloy in said cavities by performing said epitaxial growth process.

* * * * *